(12) United States Patent
Detmar et al.

(10) Patent No.: US 9,779,917 B2
(45) Date of Patent: Oct. 3, 2017

(54) PROCESS CHAMBER GAS FLOW IMPROVEMENTS

(71) Applicant: Applied Materials, Inc., Santa Clara, CA (US)

(72) Inventors: Stanley Detmar, Mountain View, CA (US); Brian T. West, San Jose, CA (US); Ronald Vern Schauer, Gilroy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1 day.

(21) Appl. No.: 14/480,799

(22) Filed: Sep. 9, 2014

(65) Prior Publication Data

US 2014/0374509 A1   Dec. 25, 2014

Related U.S. Application Data

(62) Division of application No. 13/024,094, filed on Feb. 9, 2011, now Pat. No. 8,828,182.

(Continued)

(51) Int. Cl.
*B05B 7/12*   (2006.01)
*H01J 37/32*   (2006.01)

(52) U.S. Cl.
CPC ...... *H01J 37/32449* (2013.01); *H01J 37/321* (2013.01); *H01J 37/3244* (2013.01); *H01J 2237/334* (2013.01)

(58) Field of Classification Search
CPC ............... H01J 37/32449; H01J 37/321; H01J 37/3244; H01J 37/334

(Continued)

(56) References Cited

U.S. PATENT DOCUMENTS 1,679,830 A * 8/1928 Lang ............................. 431/186
5,746,875 A * 5/1998 Maydan ............ C23C 16/45574
                                                                118/723 E (Continued)

FOREIGN PATENT DOCUMENTS

| CN | 1846871 A | 10/2006 |
|---|---|---|
| CN | 101188189 A | 5/2008 |
| KR | 10-2006-0096713 A | 8/2008 |

OTHER PUBLICATIONS

Search Report for Taiwan Application No. 100104316 dated Oct. 14, 2015.

(Continued)

*Primary Examiner* — Arthur O Hall
*Assistant Examiner* — Adam J Rogers
(74) *Attorney, Agent, or Firm* — Patterson + Sheridan LLP

(57) ABSTRACT

Embodiments of the present invention generally provide plasma etch process chamber improvements. An improved gas injection nozzle is provided for use at a central location of the lid of the chamber. The gas injection nozzle may be used in an existing plasma etch chamber and is configured to provide a series of conic gas flows across the surface of a substrate positioned within the chamber. In one embodiment, an improved exhaust kit for use in the plasma etch chamber is provided. The exhaust kit includes apparatus that may be used in an existing plasma etch chamber and is configured to provide annular flow of exhaust gases from the processing region of the chamber.

14 Claims, 4 Drawing Sheets

Related U.S. Application Data

(60) Provisional application No. 61/304,073, filed on Feb. 12, 2010.

(58) Field of Classification Search
    USPC .................................................. 239/416.5
    See application file for complete search history.

(56) References Cited

U.S. PATENT DOCUMENTS

| | | |
|---|---|---|
| 6,239,038 B1 | 5/2001 | Wen |
| 6,861,027 B2 | 3/2005 | Weaver et al. |
| 2002/0088545 A1* | 7/2002 | Lee et al. ................ 156/345.33 |
| 2004/0082251 A1* | 4/2004 | Bach ................ C23C 16/45563 445/60 |
| 2005/0109460 A1* | 5/2005 | DeDontney et al. .... 156/345.33 |
| 2006/0096540 A1* | 5/2006 | Choi ............................ 118/724 |
| 2006/0219361 A1* | 10/2006 | Wang et al. ............ 156/345.33 |
| 2009/0159424 A1 | 6/2009 | Liu et al. |
| 2009/0236313 A1* | 9/2009 | Qiu et al. ........................ 216/67 |

OTHER PUBLICATIONS

First Office Action and Search Report for Chinese Application No. 201180009422.X dated Oct. 30, 2014.
Second Office Action and Search Report for Chinese Application No. 201180009422.X dated Jul. 14, 2015.
Korean Office Action dated Nov. 20, 2015 for Application No. 10-2012-7023867.

* cited by examiner

PROCESS CHAMBER GAS FLOW IMPROVEMENTS

CROSS-REFERENCE TO RELATED APPLICATIONS

This application is a divisional application of U.S. patent application Ser. No. 13/024,094, entitled "Process Chamber Gas Flow Improvements", filed Feb. 9, 2011, that will grant as U.S. Pat. No. 8,828,182 on Sep. 9, 2014. This application claims benefit of U.S. provisional patent application Ser. No. 61/304,073, filed Feb. 12, 2010, which is herein incorporated by reference.

BACKGROUND OF THE INVENTION

Field of the Invention

Embodiments of the present invention generally relate to semiconductor substrate processing equipment. In particular, the invention relates to apparatus and methods for improving the flow of process gases within a processing chamber.

Description of the Related Art

Ultra-large-scale integrated (ULSI) circuits may include more than a million electronic devices (e.g., transistors) that are formed on a semiconductor substrate, such as a silicon (Si) substrate, and cooperate to perform various functions. Examples of electronic devices used in ULSI circuits are complementary metal-oxide-semiconductor (CMOS) field effect transistors. A CMOS transistor has a gate structure comprising a polysilicon gate electrode and gate dielectric, and is disposed between source and drain regions formed in the substrate.

Plasma etching is commonly used in the fabrication of transistors and other electronic devices. However, current plasma processing chambers suffer deficiencies in the injection, flow, and exhaust of process gases. For instance, prior art plasma etching chambers provide a plurality of gas injection nozzles located about the periphery of the chamber and a large exhaust port on one side of the chamber. This prior art configuration of gas injection and exhaust leads to unsymmetrical flow of process gases across the surface of the substrate being processed, non-uniform etching of the substrate, inefficiency in the use of process gas, and ultimately yield loss.

Therefore, there is a need for plasma etch chamber improvements to provide more efficient use of process gases and improve the uniformity of substrate processing.

SUMMARY OF THE INVENTION

In one embodiment of the present invention, a kit for use in a processing chamber comprises a gas injection nozzle configured to distribute process gas in a plurality of concentric conic gas flows across the surface of a substrate positioned on a substrate support within the processing chamber, an annular flow control member configured for positioning within the processing chamber concentrically about a process region to separate the process region from an annular exhaust region so that one or more vacuum pumps coupled to the processing chamber draw gas from a periphery of the substrate support into the annular exhaust region.

In another embodiment, a process gas injection nozzle comprises a backing member, a first tube coupled to the backing member, a second tube concentrically positioned within the first tube to form a first annular flow channel between the second tube and the first tube, and a first dispersion member coupled to the second tube such that a first annular gap is disposed between the first tube and the first dispersion member.

In yet another embodiment of the present invention, a process gas injection nozzle comprises a nozzle body having a plurality of gas passages therethrough, a plurality of dispersion members arranged to provide a plurality of annular gaps, and a plurality of gasket members having one or more slots formed therein positioned to fluidly couple the gas passages with the annular gaps.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally provide plasma etch process chamber improvements. An improved gas injection nozzle is provided for use at a central location of the lid of the chamber. The gas injection nozzle may be used in an existing plasma etch chamber and is configured to provide a series of conic gas flows across the surface of a substrate positioned within the chamber. In one embodiment, an improved exhaust kit for use in the plasma etch chamber is provided. The exhaust kit includes apparatus that may be used in an existing plasma etch chamber and is configured to provide annular flow of exhaust gases from the processing region of the chamber. Embodiments of the present invention using the gas injection and/or exhaust improvements provide more uniform flow of processing gases across the surface of the wafer, leading to more uniform etch processes. Additionally, more efficient use of process gases is achieved with embodiments of the present invention.

Figure 1:
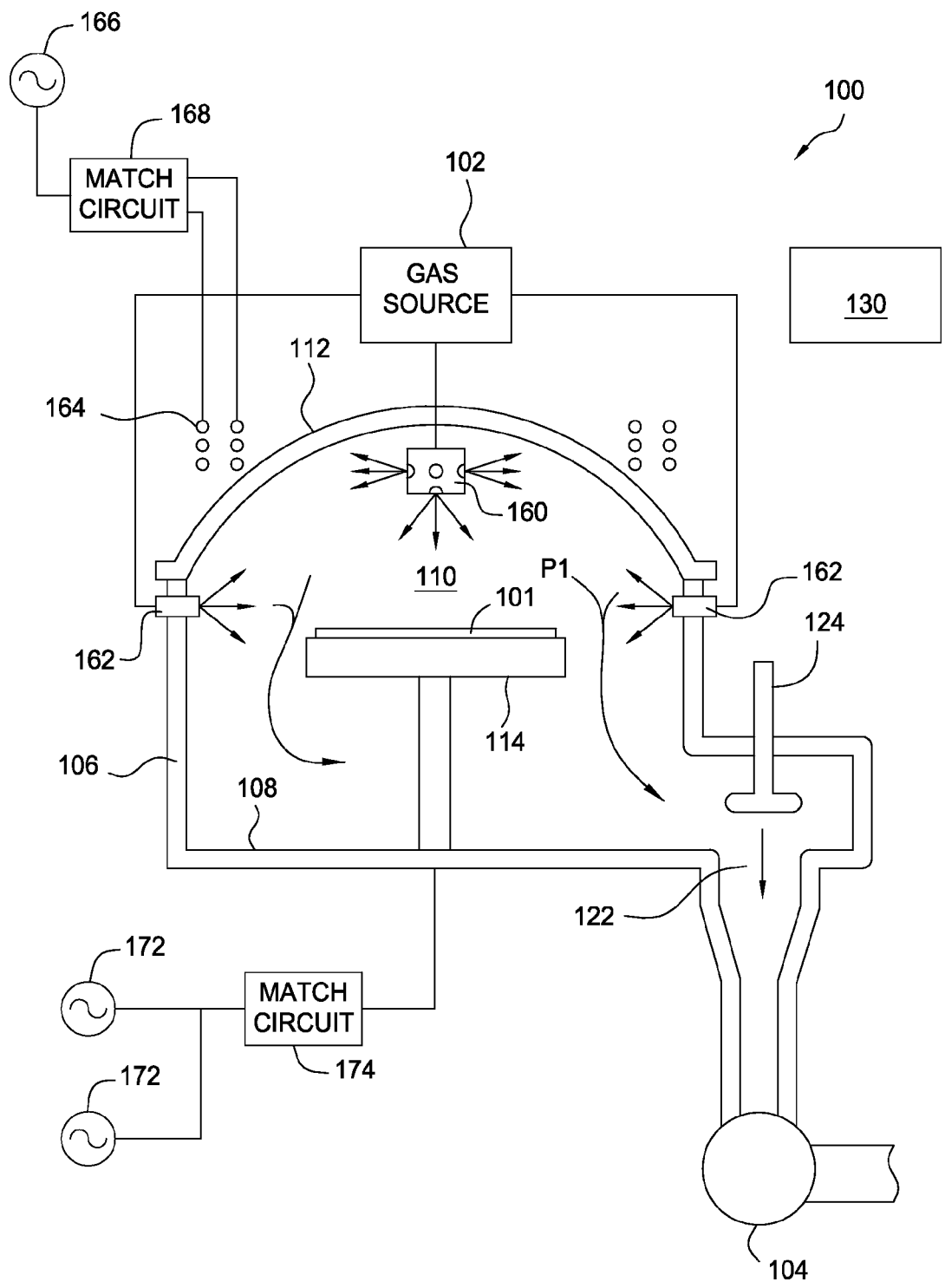
FIG. 1 is a schematic, cross-sectional view of a prior art plasma etch processing chamber.

FIG. 1 is a schematic, cross-sectional view of a prior art plasma etch processing chamber 100. The process chamber 100 has a chamber body having a sidewall 106, a bottom 108, and a dome-shaped lid 112 configured to partially enclose a process region 110. A substrate support 114 is provided centrally within the process chamber 100 such that a substrate 101 provided thereon is positioned within the process region 110. A controller 130 is provided to control various aspects of the process chamber 100.

One or more antennas or coils 164 are provided proximate the lid 112 of the process chamber 100. The coils 164 are coupled to an RF power source 166 through a match circuit 168. Power, applied to the coils 164, is inductively coupled to the process gases within the process chamber 100 to form a plasma. One or more bias power sources 172 are coupled to the substrate support 114 through a match circuit 174 to bias the substrate 101 during processing.

Process gases are provided from one or more gas sources 102 into the process region 110 of the process chamber 100 via a plurality of side injection nozzles 162 disposed peripherally in the sidewall 106 and an upper gas distribution nozzle 160 disposed in the lid 112. An exhaust port 122 is located on one side of the process chamber 100 and is coupled to a vacuum pump 104. A throttle valve 124 disposed in the vicinity of the exhaust port 122 is used in conjunction with the vacuum pump 104 to control the pressure in the process region 110.

Gas flow paths "P1" are depicted in FIG. 1 to illustrate the typical flow of gases in the prior art processing chamber 100. As can be seen, due to the configuration and location of the upper gas distribution nozzle 160, the side injection nozzles 162, and the exhaust port 122, most of the process gas flow is directed out of the process chamber 100 without being uniformly distributed across the substrate 101. In fact, it has been discovered that as much as 95% of all ionized gas within the prior art process chamber 100 is pumped directly out of the chamber 100 without contacting the substrate 101. Thus, the configuration of the gas injection and exhaust in the prior art process chamber 100 results in inefficient use of process gases as well as non-uniform etching of the substrate 101.

Figure 2:
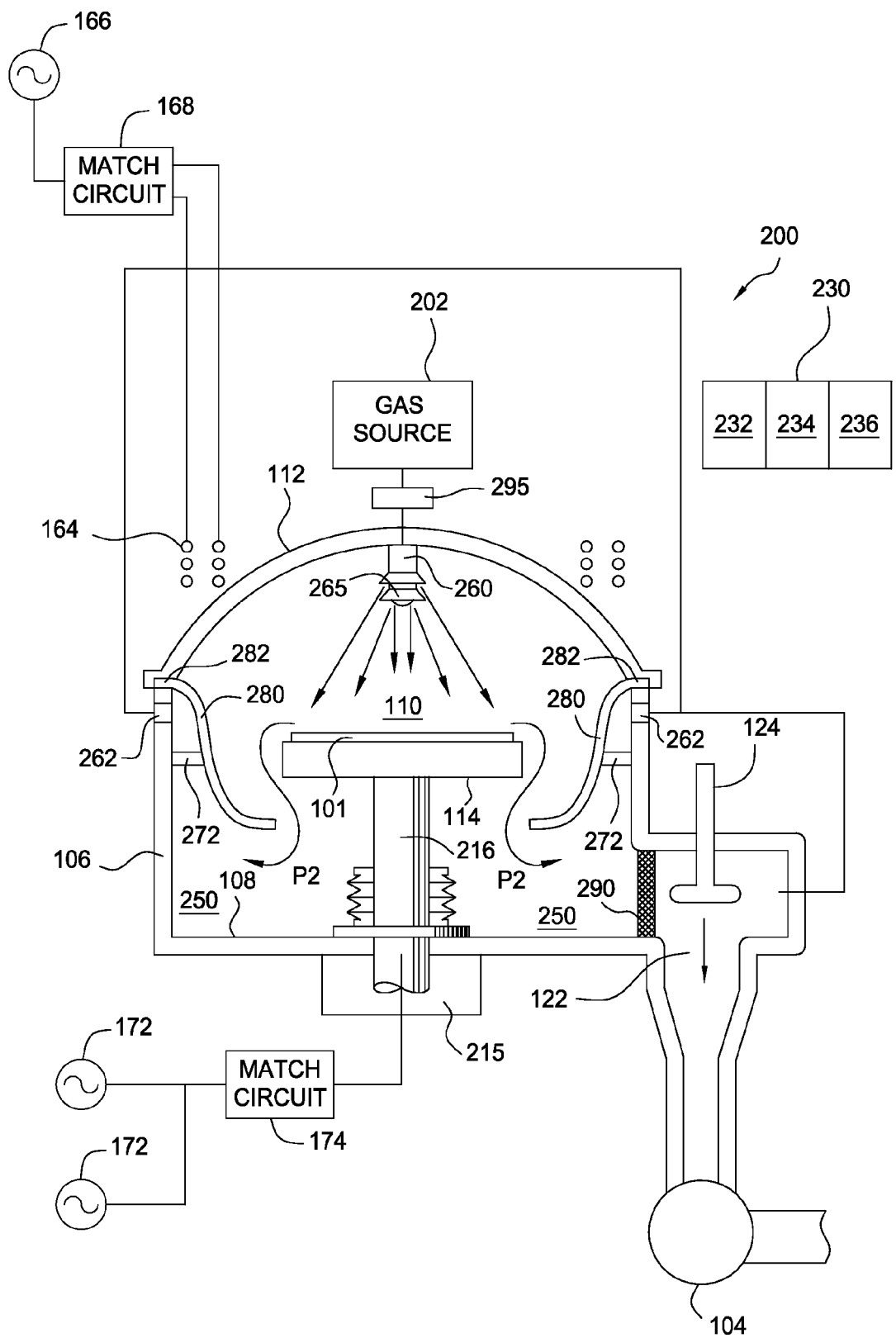
FIG. 2 is a schematic, cross-sectional view of a process chamber according to certain embodiments of the present invention.

FIG. 2 is a schematic, cross-sectional view of a process chamber 200 according to certain embodiments of the present invention. Similar to the prior art process chamber 100, the process chamber 200 has a chamber body having a sidewall 106, a bottom 108, and a dome-shaped lid 112 configured to partially enclose a process region 110. A substrate support 114 is provided centrally within the process chamber 100 such that a substrate 101 provided thereon is positioned within the process region 110. The substrate support 114 may be support by a stem 216. The stem 216 may be coupled to an actuator, such as a motor 215 for vertical movement of the substrate support 114. A controller 230 is coupled to the motor 215 and one or more motion control sensors (not shown) to provide control of the vertical movement of the substrate support before, during, or after processing.

The controller 230 generally includes a memory 232, a CPU 234, and support circuits 236. The CPU 234 may be one of any form of computer processor that can be used in an industrial setting for controlling various chambers and processes. The support circuits 236 are coupled to the CPU 234 for supporting the processor in a conventional manner. These circuits include cache, power supplies, clock circuits, input/output circuitry, subsystems, and the like. The memory 232 is coupled to the CPU 234. The memory 232, or computer-readable medium, may be one or more of readily available memory such as random access memory (RAM), read only memory (ROM), or any other form of digital storage, local or remote. Instructions for performing processes may be stored on the memory 232. The instructions, when executed by the controller 230, cause the processing chamber 200 to perform processes, such as a plasma etch process.

In one embodiment, the controller 230 may coordinate vertical movement of the substrate 101 during processing via the motor 215, stem 216, and substrate support 114. In one embodiment, the controller 230 may coordinate vertical movement of the substrate 101 in a manner such that small variations in plasma characteristics, process material flow patterns, and exhaust patterns may be compensated for or modulated to achieve a desired etching profile. In one example, the controller 230 coordinates vertical movement of the substrate 101 in coordination with process recipe changes or other processing parameters, such as material flows, material supply patterns, material types, RF and DC field ramping or pulsing, temperature of the chamber 200, temperature of the substrate support 114, and the like.

As with the process chamber 100, one or more antennas or coils 164 are provided proximate the lid 112 of the process chamber 200. The coils 164 are coupled to an RF power source 166 through a match circuit 168. Power, applied to the coils 164, is inductively coupled to the process gases within the process chamber 100 to form a plasma. One or more bias power sources 172 are coupled to the substrate support 114 through a match circuit 174 to bias the substrate 101 during processing. Control of the RF power source 166 and bias power sources 172 may be provided by the controller 230.

In one embodiment, process gas is provided from one or more gas sources 202 through a gas distribution nozzle 260 located centrally within the dome-shaped lid 112. In one embodiment, the gas distribution nozzle 260 is located in the same position within the process chamber 200 as the upper gas distribution nozzle 160 in the process chamber 100. Thus, the process chamber 100 may be retrofit with the gas distribution nozzle 260. However, the gas distribution nozzle 260 includes several improvements over that of the gas distribution nozzle 160. In one embodiment, the gas distribution nozzle 260 includes a plurality of features 265 configured therein to provide an even distribution of process gas across the face of the substrate 101. The features 265 may include one or more controllable gas inlets and one or more specially shaped gas outlets for each gas inlet. The gas outlets may include apertures, annuli, shaped nozzles, flow directing profiles, and the like. In one embodiment, the gas flows through respective inlets and outlets are controlled via mass flow controllers 295 for balancing or modulating the respective flows. In another embodiment, the position of the features 265 may be automatically adjusted or modulated via one or more motors controlled by the controller 230. In certain embodiments, modulation of the features 265 may be controlled during processing cycles to impart acoustic energies and shaped pressure pulses into the process gas flows enabling greater control over specific processes performed on the substrate 101 in the process chamber 200.

In one embodiment, the gas distribution nozzle 260 utilizes the Coanda effect to inject gas through one or more annular apertures in the nozzle 260. In such an embodiment, the gas flow follows a predetermined path along a surface of the nozzle 260 until it is forced to separate at a desired angle from the surface of the nozzle 260. In one embodiment, a plurality of features 265 exhibiting the Coanda effect are utilized to create a series of conic gas flows tailored to supply even gas flow to the surface of the substrate 101. Additionally, features 265 within the nozzle 260 may be configured to cause the gas flow to spin and mix during transit to the surface of the substrate 101. Specific examples of gas distribution nozzles 260 are subsequently described with respect to FIGS. 3 and 4.

In one embodiment, similar to the process chamber 100 in FIG. 1, an exhaust port 122 is located on one side of the process chamber 200 and is coupled to a vacuum pump 104. A throttle valve 124 disposed in the vicinity of the exhaust port 122 is used in conjunction with the vacuum pump 104 to control the pressure in the process region 110. In one embodiment, a restriction member 290 is positioned in the side entrance to the exhaust port 122. The restriction member 290 may be configured to restrict or prevent gas flow through the side entrance to the exhaust port 122. In one embodiment, the same vacuum pump 104 and throttle valve 124, or one or more additional vacuum pumps 104 and/or throttle valves 124, are in fluid communication with a plurality of side exhaust ports 262 disposed in the sidewall 106 about the periphery of the chamber 200. In one embodiment, the locations of the exhaust ports 262 in the process chamber 200 coincide with the locations of the side gas injection nozzles 162 in the process chamber 100. Thus, the chamber 100 may be retrofitted with the exhaust ports 262 in place of the side gas injection nozzles 162.

In one embodiment, an annular flow control member 280 is disposed within the process chamber 200 to separate the process region 110 from an exhaust region 250. The annular flow control member 280 may be configured to extend from an upper portion of the sidewall 106 to an area between the substrate support 114 and the bottom 108 of the process chamber 200. Thus, the process region 110 of the process chamber 200 is more rounded and uniform than the process region 110 of the prior art chamber 100 resulting in more concentrated plasma in the process region 110 and leading to higher ion collisions and higher plasma densities than possible in the prior art chamber 100.

In one embodiment, the annular flow control member 280 is a substantially bowl-shaped member with a central opening 281 having a diameter that is slightly greater than the diameter of the substrate support 114, such as greater than 200 mm. The annular flow control member 280 may have an upper convex portion 283 extending from an upper lip 284 downwardly to a lower concave portion 285. The lower concave portion 285 may extend to a lower lip 286 that defines the opening 281.

In one embodiment, the annular flow control member 280 includes one or more connection features 282 at its upper periphery for attaching to an upper portion of the side wall 106. Thus, the annular flow control member 280 may be retrofit to the process chamber 100. In one embodiment, the flow control member 280 is one continuous, solid piece. In one embodiment, the flow control member 280 has a plurality of apertures or perforations formed therethrough for specifically tailoring gas flow therethrough. In one embodiment, the flow control member 280 is made of a metallic material, such as aluminum or stainless steel. In another embodiment, the flow control member 280 is made of a ceramic or polymeric material that is resistant to plasma etching processes performed in the process chamber 200. In one embodiment, the flow control member 280 is spaced apart from the sidewall 106 and/or bottom 108 of the chamber 200 via one or more spacers 272.

Gas flow paths "P2" are depicted in FIG. 2 to illustrate the improved flow of gases in the process chamber 200. As can be seen, due to the configuration and location of the gas distribution nozzle 260 and the flow control member 280, gas flow is evenly distributed over the surface of the substrate 101 and drawn down between the perimeter of the substrate support 114 and the flow control member 280. After leaving the surface of the substrate 101, the gas flow is drawn between the flow control member 280 and the bottom 108 of the process chamber 200. The gas is then drawn out of the process chamber 200 through the exhaust ports 262 and/or 122.

The improved gas flow path "P2" results in a significant increase in process gas utilization efficiency and RF power efficiency. These greater efficiencies also result in reduced heating of the process chamber 200, which results in improved efficiency and reduced effluents. Further, by drawing the exhaust process gas through lower regions of the chamber 200, the processing plasma is inhibited or prevented from reaching the exhaust ports 262 and/or 122, which suppresses the formation of deposits in those areas resulting in reduced time needed for cleaning the chamber 200 and a lower chance of particulates developing on the surface of the substrate 101.

In one embodiment, the gas distribution nozzle 260 and the annular flow control member 280 may be provided in a kit along with the hardware needed to retrofit a plasma etch chamber, such as the chamber 100. In one embodiment, the kit may further include restriction member 290. In one embodiment, the kit may include the necessary hardware and tubing to convert the injection nozzles 162 to exhaust ports 262.

Figure 3:
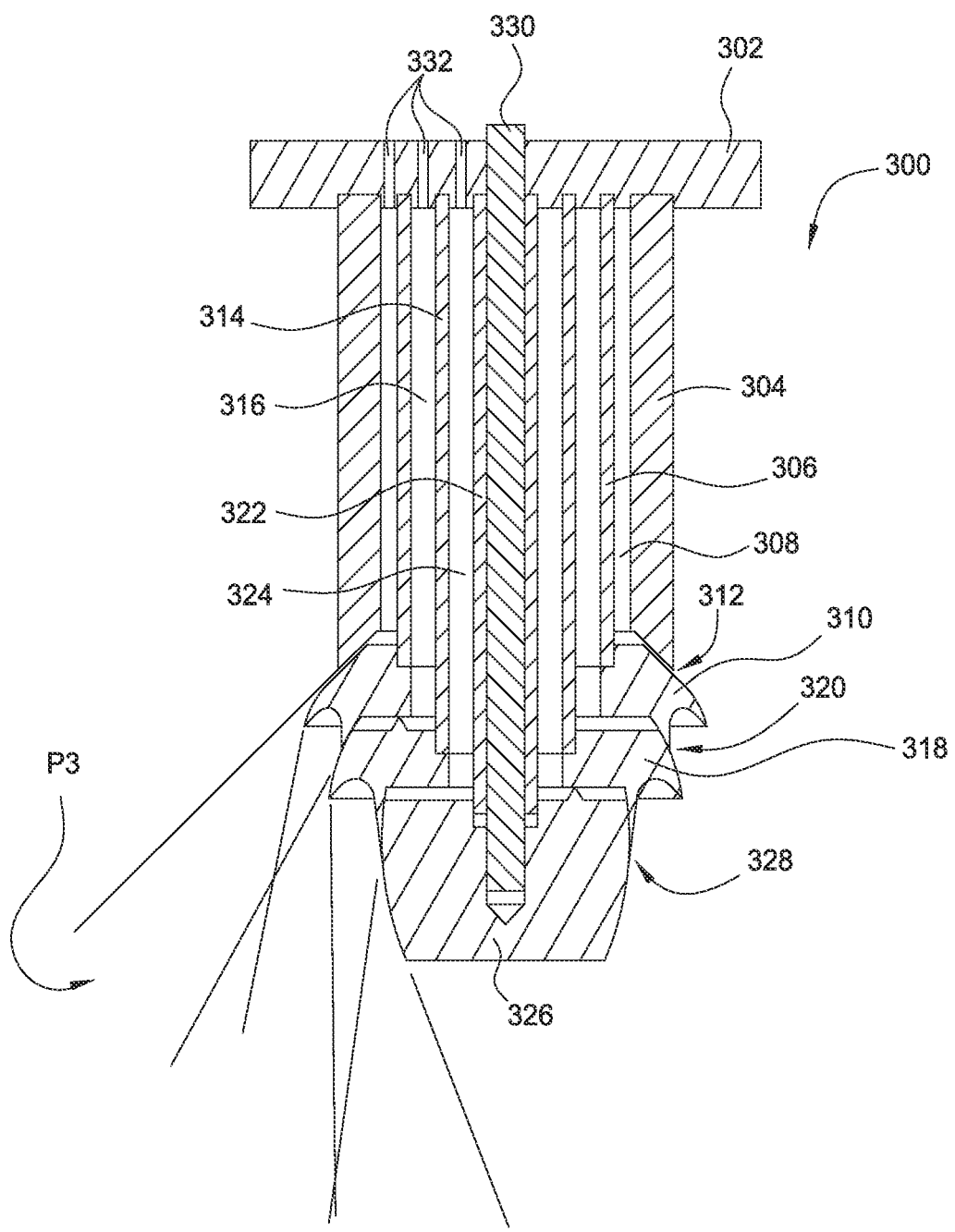
FIG. 3 is a schematic, cross-sectional view of a gas distribution nozzle for use in the process chamber of FIG. 2 according to one embodiment of the present invention.

FIG. 3 is a schematic, cross-sectional view of a gas distribution nozzle 300 for use in the process chamber 200 according to one embodiment of the present invention. The embodiment depicted in FIG. 3 includes a plurality of nested tubes of different lengths to provide a plurality of flow gaps for the process gas resulting overlapping conical gas flow "P3" evenly distributed across the substrate 101 in the process chamber 200 depicted in FIG. 2.

In one embodiment, the gas distribution nozzle 300 includes a backing member 302 that may be configured to attach to one or more process gas inlet tubes. The gas distribution nozzle 300 further includes an outer tubing 304 attached to the backing member 302. In one embodiment, a first intermediate tubing 306 is concentrically positioned within the outer tubing 304 and engaged with the backing member 302 such that an outer annular flow channel 308 is defined by the outer surface of the first intermediate tubing 306 and the inner surface of the outer tubing 304. A first dispersion member 310 is configured to engage the lower end of the first intermediate tubing 306 leaving an outer annular gap 312 between the first dispersion member 310 and the lower end of the outer tubing 304 such that the outer annular gap 312 is in fluid communication with the outer annular flow channel 308. The first dispersion member 310 may be movably engaged with the first intermediate tubing 306 (e.g., screw connection) such that the outer annular gap 312 is adjustable to adjust the flow of process gas dispersed therethrough. In one embodiment, the first dispersion member 310 is fixedly attached to the first intermediate tubing 306 to maintain spacing for process gas flow. In another embodiment, the first dispersion member includes a plurality of protrusions equally spaced in a circular pattern thereon to engage the outer tubing 304 and maintain spacing for process gas flow.

In one embodiment, a second intermediate tubing 314 is concentrically positioned within the first intermediate tubing 306 and engaged with the backing member 302 such that an intermediate annular flow channel 316 is defined by the outer surface of the second intermediate tubing 314 and the inner surface of the first intermediate tubing 306. A second dispersion member 318 is configured to engage the lower end of the second intermediate tubing 314. One or more orifices 320 may be disposed within the first dispersion member 310, which are in fluid communication with the intermediate annular flow channel 316. The orifices 328 may be spaced equidistant around the circumference of the first dispersion member 310. The second dispersion member 318 may be movably engaged with the second intermediate tubing 314 (e.g., screw connection) such that the intermediate annular gap 321, which is also in fluid communication with the intermediate annular flow channel 316, is formed between the second dispersion member 318 and the first dispersion member 310. The intermediate annular gap 321 may be adjustable to adjust the flow of process gas dispersed therethrough using the movable engagement between the second dispersion member 318 and the second intermediate tubing 314. In one embodiment, the second dispersion member 318 is attached to the second intermediate tubing 314 to maintain spacing for process gas flow. In another embodiment, the second dispersion member 318 includes a plurality of protrusions extending upwardly therefrom to engage the first dispersion member 310 and maintain spacing for process gas flow.

In one embodiment, an inner tubing 322 is concentrically positioned within the second intermediate tubing 314 and engaged with the backing member 302 such that an inner annular flow channel 324 is defined by the outer surface of the inner tubing 322 and the inner surface of the second intermediate tubing 314. A third dispersion member 326 is configured to engage the lower end of the inner tubing 322. One or more orifices 328 may be disposed within second dispersion member 318, which is in fluid communication with the inner annular flow channel 324. The orifices 328 may be spaced equidistant around the circumference of the second dispersion member 318. The third dispersion member 326 may be movably engaged with the inner tubing 322 (e.g., screw connection) such that an inner annular gap 329 is formed between the third dispersion member 326 and the second dispersion member 318, which is also in fluid communication with the inner annular flow channel 324. The inner annular gap 329 may be adjusted using the movable engagement between the third dispersion member 326 and the inner tubing 322 to adjust the flow of process gas dispersed therethrough. In one embodiment, the third dispersion member 326 is attached to the inner tubing 322 to maintain spacing for gas flow. In another embodiment, the third dispersion member 326 includes a plurality of protrusions extending therefrom to engage the second dispersion member 318 and maintain spacing for process gas flow.

In one embodiment, a central rod 330 or bolt engages the backing member 302 and the third dispersion member 326 to fasten the individual parts of the gas distribution nozzle 300 together. In one embodiment, the central rod 330 may be extended or retracted to adjust the outer annular gap 312, the intermediate annular gap 321, and the inner annular gap 329, which, in turn adjusts the flow pattern of the process gas dispersed through the gas distribution nozzle 300. The adjustment of central rod 330 and or gaps 312, 321, 329 may be made manually, such as by a threaded connection. Alternatively, the adjustment may be made automatically by one or more actuators, such as linear thrusters or piezoelectric motors, and controlled by the controller 230. In one embodiment, the outer annular gap 312, the intermediate annular gap 321, and the inner annular gap 329 are adjusted by changing the lengths of the outer tubing 304, the first intermediate tubing 306, the second intermediate tubing 314, and the inner tubing 322, respectively. In addition, the tube diameters and wall thicknesses may be adjusted to provide desired volumes for the outer annular flow channel 308, the intermediate annular flow channel 316, and the inner annular flow channel 324. Each of the components of the gas distribution nozzle 300 may comprise materials resistant to the specific process gases used in the desired application, such as ceramic materials (e.g., $Al_2O_3$, SiC, SiN), metallic materials (e.g., anodized aluminum, stainless steel, nickel), or resistive polymeric materials.

The backing member 302 may have a plurality of apertures 332 formed therethrough for allowing passage of process gas from one or more process gas inlet tubes through the backing member 302 and into desired flow channels in the gas distribution nozzle 300. The apertures 332 may be configured to transfer process gas from a single gas inlet into each of the separate flow channels, i.e., the outer annular flow channel 308, the intermediate annular flow channel 316, and the inner annular flow channel 324. The apertures 332 may be configured to transfer process gas from a separate inlet tube to each of the flow channels, respectively. For instance, a first inlet tube may be connected to the outer annular flow channel 308, and second inlet tube may be connected to the intermediate annular flow channel 316, and a third inlet tube may be connected to the inner annular flow channel 324. In one embodiment, each of the inlet tubes is connected to separate gas sources. In one embodiment, each of the inlet tubes is connected via separate mass flow controllers to a single process gas source in order to separately modulate flow through each annular gap in the gas distribution nozzle 300.

It should be noted that although the gas distribution nozzle 300 depicted and described with respect to FIG. 3 is configured for three concentric dispersion gaps, tubing and dispersion members may be added or subtracted from the assembly to obtain a greater or fewer number of dispersion gaps as desired. As a result, the gas distribution nozzle 300 may achieve any desired configuration of overlapping conical gas flow evenly distributed across the substrate 101 in the process chamber 200 depicted in FIG. 2.

Figure 4:
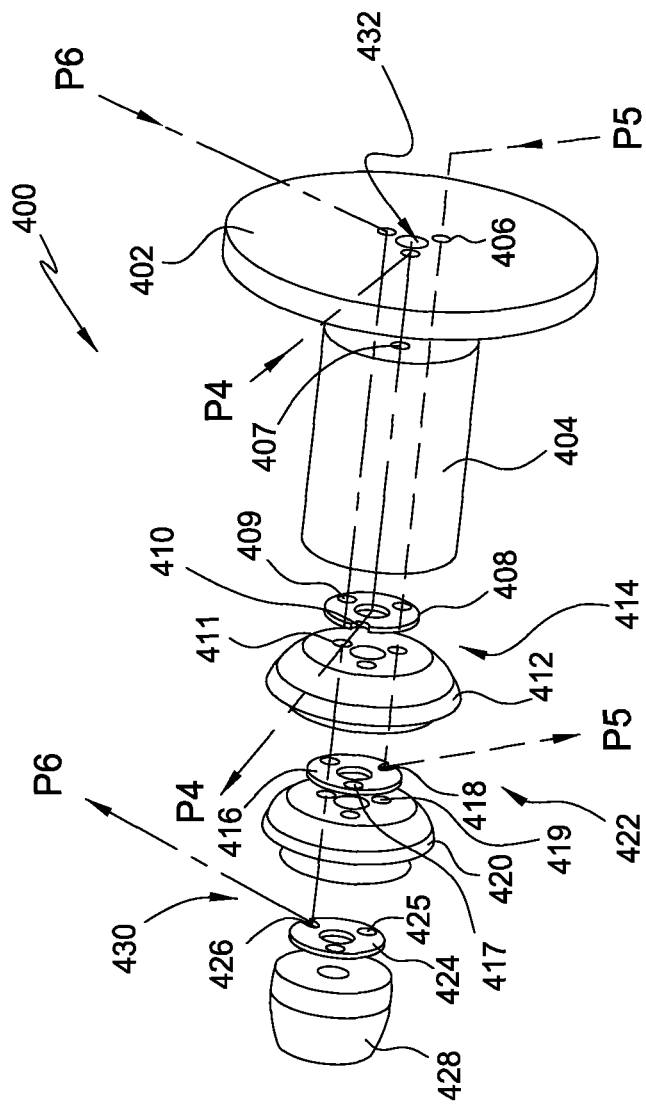
FIG. 4 is a schematic, isometric, exploded view of a gas distribution nozzle according to another embodiment of the present invention.

FIG. 4 is a schematic, isometric, exploded view of a gas distribution nozzle 400 according to another embodiment of the present invention. The embodiment depicted in FIG. 4 includes a plurality of intersection gaskets configured to selectively direct the flow of process gas through a plurality of annular gaps to provide overlapping conical gas flow (similar to the gas flow "P3" in FIG. 3) evenly distributed across the substrate 101 in the process chamber 200 depicted in FIG. 2.

In one embodiment, the gas distribution nozzle 400 includes a backing member 402 attached to a nozzle body 404. Both the backing member 402 and the nozzle body 404 have a plurality of aligned apertures 406, 407 disposed therethrough to allow passage of one or more process gases therethrough. The backing member 402 may be configured to couple to one or more process gas inlet tubes to provide a supply of process gas to the gas distribution nozzle 400.

A first gasket 408 may be positioned between the nozzle body 404 and a first dispersion member 412. Both the first gasket 408 and the first dispersion member 412 have a plurality of apertures 409, 411, formed therethrough and aligned with the plurality of apertures 407 formed through the nozzle body 404. The first dispersion member 412 is engaged with the nozzle body 404 such that a first annular gap 414 is provided between the first dispersion member 412 and the nozzle body 404. The first gasket 408 further includes one or more slots 410 formed therethrough and selectively aligned with one or more of the apertures 406 in the nozzle body 404. The one or more slots 410 are open to the edge of the first gasket 408 to allow passage of a process gas from one or more of the apertures 406 and through the first annular gap 414. As a result, a process gas may flow along the path "P4" from a gas inlet tube, through the backing member 402 and the nozzle body 404 for dispersion through the first annular gap 414 as shown in FIG. 4.

A second gasket 416 may be positioned between the first dispersion member 412 and a second dispersion member 420. Both the second gasket 416 and the second dispersion member 420 have a plurality of apertures 417, 419 formed therethrough and aligned with the plurality of apertures 411 formed through the first dispersion member 412. The second dispersion member 420 is engaged with the first dispersion member 412 such that a second annular gap 422 is provided between the second dispersion member 420 and the first dispersion member 412. The second gasket 416 further includes one or more slots 418 formed therethrough and selectively aligned with one or more of the apertures 411 formed through the first dispersion member 412. The one or more slots 418 are open to the edge of the second gasket 416 to allow passage of a process gas from one or more apertures 411 and through the second annular gap 422. As a result, a process gas may flow along the path "P5" from a gas inlet tube, through the backing member 402, the nozzle body 404, the first gasket 408, and the first dispersion member 412 for dispersion through the second annular gap 422 as depicted in FIG. 4.

In one embodiment, a third gasket 424 is positioned between the second dispersion member 420 and a third dispersion member 428. The third gasket 424 has a plurality of apertures 425 formed therethrough and aligned with the plurality of apertures 417 formed through the second dispersion member 420. The third dispersion member 428 is engaged with the second dispersion member 420 such that a third annular gap 430 is provided between the third dispersion member 428 and the second dispersion member 420. The third gasket 424 further includes one or more slots 426 formed therethrough and selectively aligned with one or more of the apertures 417 formed through the second dispersion member 420. The one or more slots 426 are open to the edge of the third gasket 424 to allow passage of a process gas from one or more apertures 417 and through the third annular gap 430. As a result, a process gas may flow along the path "P6" from a gas inlet tube, through the backing member 402, the nozzle body 404, the first gasket 408, the first dispersion member 412, the second gasket 416, and the second dispersion member 420 for dispersion through the third annular gap 430 as depicted in FIG. 4.

A central rod 432 or bolt may engage the backing member 402 and the third dispersion member 428 to fasten the individual parts of the gas distribution nozzle 400 together. Note, the central rod 432 is shown in phantom in FIG. 4 for clarity. One or more of the dispersion members 412, 420, 428 and/or gaskets 408, 416, 424 may be attached to the central rod 432 such that when the central rod 432 is rotated, one or more of the apertures are overlapped to varying degrees, resulting in an adjustment to the flow of process gas flowing therethrough. In one embodiment, the adjustment of the central rod 432 and process gas flow through the gas distribution nozzle 400 is made manually. Alternatively, the adjustment may be made automatically by one or more actuators, such as motors, and controlled by the controller 230. The size and number of the various apertures or thickness of the various gaskets may be altered to provide desired gas flow. Each of the components of the gas distribution nozzle 400 may comprise materials resistant to the specific process gases used in the desired application, such as ceramic materials (e.g., $Al_2O_3$, SiC, SiN), metallic materials (e.g., anodized aluminum, stainless steel, nickel), or resistive polymeric materials.

It should be noted that although the gas distribution nozzle 400 depicted and described with respect to FIG. 4 is configured for three concentric dispersion gaps, gaskets and dispersion members may be added or subtracted from the assembly to obtain a greater or fewer number of dispersion gaps as desired. As a result, the gas distribution nozzle 400 may achieve any desired configuration of overlapping conical gas flow evenly distributed across the substrate 101 in the process chamber 200 depicted in FIG. 2.

Thus, embodiments of the present invention generally provide plasma etch process chamber improvements. In one embodiment, an improved gas injection nozzle is provided at a central location of the lid of the chamber. The gas injection nozzle may be used in an existing plasma etch chamber is configured to provide a series of conic gas flows across the surface of a substrate positioned within the chamber. In one embodiment, an improved exhaust configuration is provided. The exhaust configuration includes apparatus that may be used in an existing plasma etch chamber and is configured to provide annular flow of exhaust gases from the processing region of the chamber. Embodiments of the present invention using the gas injection and/or exhaust improvements provide more uniform flow of processing gases across the surface of the wafer leading to more uniform etch processes. Additionally, more efficient use of process gases is achieved with embodiments of the present invention.

While the foregoing is directed to embodiments of the present invention, other and further embodiments of the invention may be devised without departing from the basic scope thereof, and the scope thereof is determined by the claims that follow.

The invention claimed is:

1. A process gas injection nozzle, comprising:
   a nozzle body having a plurality of gas passages therethrough;
   a plurality of dispersion members arranged to provide a plurality of annular gaps;
   a plurality of gasket members having one or more slots formed therein positioned to fluidly couple the gas passages with the annular gaps, wherein at least one of the gasket members is positioned between at least two of the dispersion members; and
   a central rod disposed therethrough and coupled to the plurality of gasket members, wherein the central rod is rotatable so that one or more slots are overlapped.

2. A process gas injection nozzle, comprising:
   a nozzle body having a plurality of apertures disposed therethrough;
   a first dispersion member having a plurality of apertures formed therethrough and aligned with the plurality of apertures disposed through the nozzle body;
   a second dispersion member having a plurality of apertures formed therethrough and aligned with the plurality of apertures formed through the first dispersion member;
   a first gasket positioned between the nozzle body and the first dispersion member, the first gasket having a plurality of apertures formed therethrough and aligned with the plurality of apertures disposed through the nozzle body;
   a second gasket positioned between the first dispersion member and the second dispersion member, the second gasket having a plurality of apertures formed therethrough and aligned with the plurality of apertures disposed through the first dispersion member; and
   a central rod disposed through the nozzle body and the first and second dispersion members and the first and second gaskets, wherein the central rod is rotatable so that one or more of the apertures of the first and second dispersion members and/or one or more of the apertures of the first and second gaskets are overlapped.

3. The process gas injection nozzle of claim 2, further comprising:

a third dispersion member having a plurality of apertures formed therethrough and aligned with the plurality of apertures formed through the second dispersion member; and a third gasket positioned between the second dispersion member and the third dispersion member, the third gasket having a plurality of apertures formed therethrough and aligned with the plurality of apertures disposed though the second dispersion member, wherein the central rod is disposed through the nozzle body, the first, second, and third dispersion members, and the first, second, and third gaskets, and wherein the central rod is rotatable so that one or more of the apertures of the first, second, and third dispersion members and/or one or more of the apertures of the first, second, and third gaskets are overlapped.

4. The process gas injection nozzle of claim 2, further comprising:

a backing plate attached to the nozzle body, the backing plate having a plurality of apertures aligned with the plurality of apertures disposed through the nozzle body.

5. The process gas injection nozzle of claim 3, wherein the first gasket comprises one or more slots formed therethrough and selectively aligned with the one or more of the apertures disposed through the nozzle body.

6. The process gas injection nozzle of claim 5, wherein the one or more slots of the first gasket are open to an edge of the first gasket.

7. The process gas injection nozzle of claim 6, wherein the second gasket comprises one or more slots formed therethrough and selectively aligned with the one or more of the apertures disposed through the first dispersion member.

8. The process gas injection nozzle of claim 7, wherein the one or more slots of the second gasket are open to an edge of the second gasket.

9. The process gas injection nozzle of claim 8, wherein the third gasket comprises one or more slots formed therethrough and selectively aligned with the one or more of the apertures disposed through the second dispersion member.

10. The process gas injection nozzle of claim 9, wherein the one or more slots of the third gasket are open to an edge of the third gasket.

11. The process gas injection nozzle of claim 2, wherein the nozzle body and the first, second, and third dispersion members and the first, second, and third gaskets comprises ceramic materials, metallic materials, or resistive polymeric materials.

12. The process gas injection nozzle of claim 2, wherein the first dispersion member is engaged with the nozzle body such that a first annular gap is provided between the first dispersion member and the nozzle body.

13. The process gas injection nozzle of claim 2, wherein the second dispersion member is engaged with the first dispersion member such that a second annular gap is provided between the second dispersion member and the first dispersion member.

14. The process gas injection nozzle of claim 3, wherein the third dispersion member is engaged with the second dispersion member such that a third annular gap is provided between the third dispersion member and the second dispersion member.

* * * * *